United States Patent [19]

Meany

[11] 3,939,381

[45] Feb. 17, 1976

[54] UNIVERSAL BURN-IN FIXTURE

[75] Inventor: David P. Meany, Anaheim, Calif.

[73] Assignee: MCM Industries, Inc., Anaheim, Calif.

[22] Filed: Mar. 22, 1974

[21] Appl. No.: 453,858

[52] U.S. Cl.......... 317/101 R; 317/101 C; 338/308; 174/68.5
[51] Int. Cl.².... H02B 1/04; H01C 1/00; H05K 1/16
[58] Field of Search ........ 317/101 R, 101 B, 101 C, 317/101 CC; 338/254, 262, 306, 307, 308, 312, 314; 174/68.5

[56] References Cited
UNITED STATES PATENTS

| 3,344,387 | 9/1967 | Kinkel et al. | 338/308 X |
| 3,474,304 | 10/1969 | Currin et al. | 338/308 X |
| 3,487,268 | 12/1969 | Ljungdell et al. | 338/308 X |
| 3,601,745 | 8/1971 | Helgeland | 338/308 X |
| 3,605,061 | 9/1971 | Martin | 317/101 B X |
| 3,648,364 | 3/1972 | Endo | 338/308 X |
| 3,784,951 | 1/1974 | Steidel | 338/308 X |
| 3,832,602 | 8/1974 | Engelhard et al. | 317/101 R |

Primary Examiner—James R. Scott
Attorney, Agent, or Firm—Charles H. Schwartz

[57] ABSTRACT

A universal burn-in fixture including a printed circuit board having a plurality of regularly spaced areas and with each area receiving a semiconductor socket and with the socket having lead members for connection to the board through a plurality of holes and with the majority of the holes surrounded by a conductive pad area which form islands and with each pad surrounded by an insulating area and with the remaining portion of the printed circuit board forming a conductive land area and with substantially the entire printed circuit board covered by a resistive coating to produce resistances between each pad and the surrounding land, to provide for desired resistances between a socket lead and the land area. A voltage is coupled to the land area to supply the desired burn-in voltage at the socket leads.

15 Claims, 10 Drawing Figures

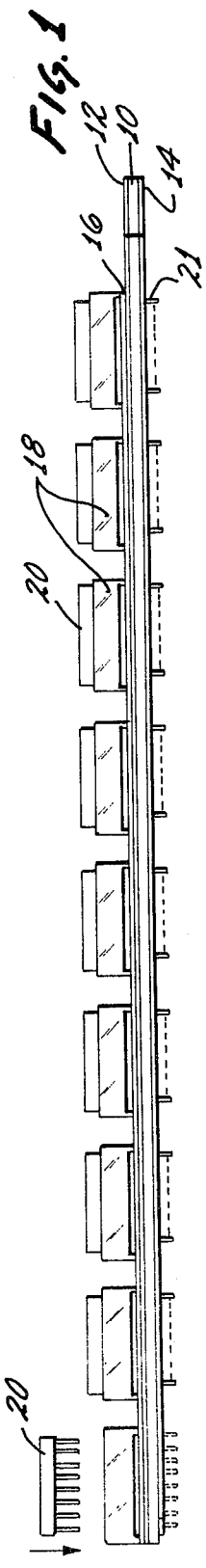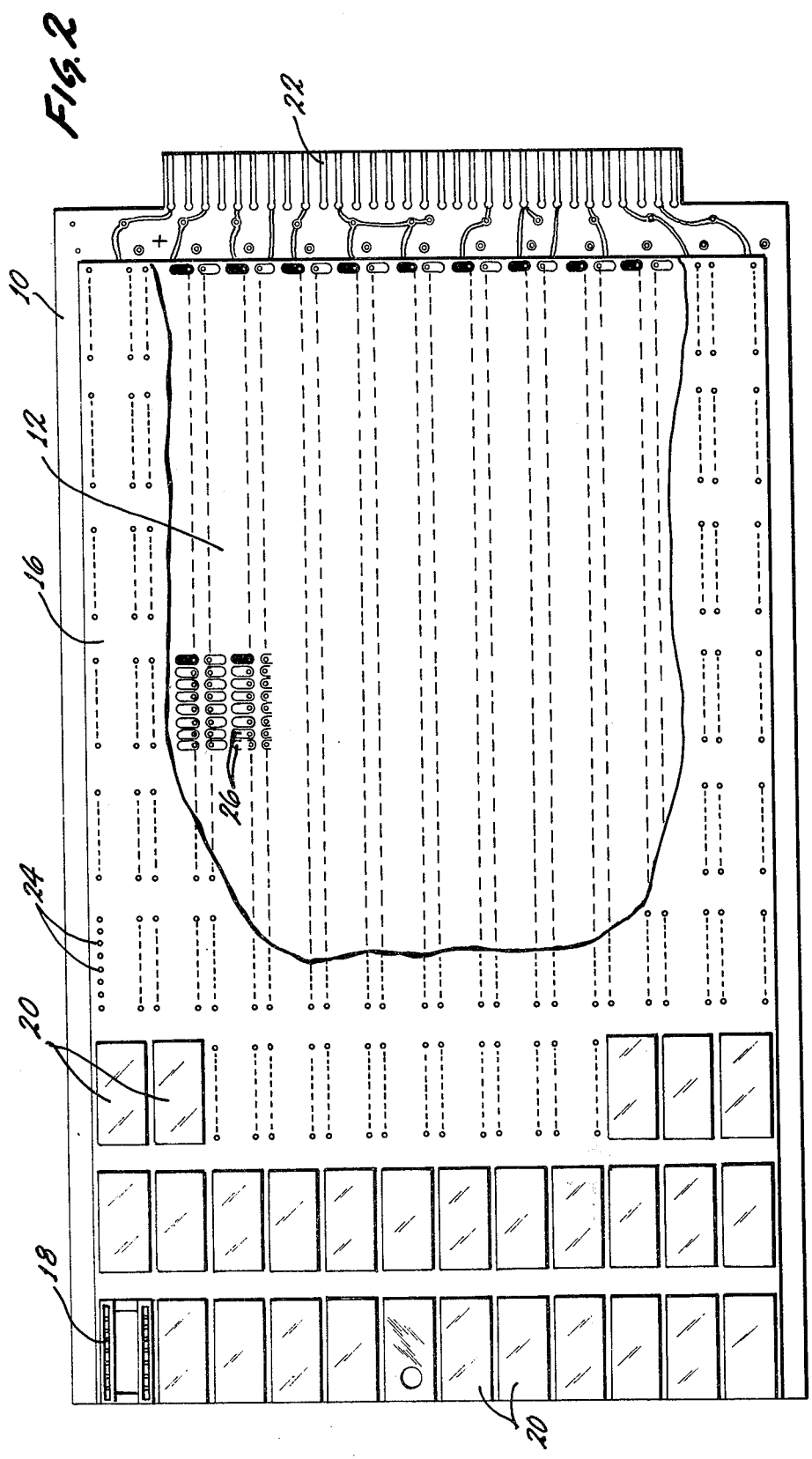

UNIVERSAL BURN-IN FIXTURE

The present invention is directed to a universal burn-in fixture wherein a plurality of semiconductors devices may be aged at an accelerated rate. The specific structure used to produce the universal burn-in fixture of the present invention may also be used to produce printed circuit boards having a multiplicity of resistors but with a simpler construction and method of production than the prior art printed circuit boards with integral resistors.

It is a constant goal in the semiconductor industry to improve reliability of semiconductor devices. Specifically, integrated circuits often fail during their initial stage of operation. It would therefore be desirable to eliminate these integrated circuits which may fail at a time prior to their being installed in equipment. A procedure known as "burn-in" where the semiconductor device is aged at an accelerated rate has been employed as a means to improve the reliability of the semiconductors by providing rapid failure of the defective semiconductor devices.

Semiconductor devices if properly manufactured do not have any inherent "wear out" mechanism. If the semiconductor devices are properly manufactured, they should operate indefinitely and are not affected by normal operation or by a properly administered "aging" or "burn-in" program. Unfortunately, the process of manufacturing the semiconductor device introduces several physical mechanisms, any one of which may fail during the operation of the semiconductor device to cause the ultimate failure of the semiconductor device. Therefore many semiconductor devices, auch as integrated circuits, do fail after a short period of operation when part of a manufactured device. The particular failure mechanisms in the semiconductors devices can be directly affected by a burn-in program so as to produce a failure of the semiconductor device if such a failure had inherently existed in the device. The burn-in program is therefore used to screen out semiconductor devices which would fail in the field before the semiconductor device is installed as a part of a manufactured item.

The burn-in of semiconductor devices is therefore desirable because the ultimate reliability may be greatly enhanced by using properly designed burn-in techniques so as to rapidly age the semiconductor devices and thereby prematurely operate the failure mechanisms in the semiconductor devices. Generally, a burn-in program for particular semiconductor devices should have the following conditions. First, a set of conditions that approximate but do not exceed the worse case conditions for the device being aged. Secondly, an increased temperature to directly increase the rate of the aging reaction. After the burn-in has been accomplished, then, of course, the semiconductors must be subjected to properly designed measuring equipment using test techniques so as to separate the devices that have either failed or show a trend towards failure. Once these steps have been performed, the remaining semiconductor devices show a marked improvement in reliability since the number of failures in the field are greatly decreased.

Although there are several accepted burn-in methods, the present invention will be described with reference to a particularly chosen burn-in method which is generally defined as a steady state reverse bias burn-in method. Since this particular type of burn-in method meets all of the general, as well as most of the worst case requirements of a good burn-in program, most independent test laboratories have adopted this method as standard. Essentially, this burn-in method requires that all inputs be reversed biased and that power be applied to the power terminal and that the ground terminal be grounded.

In order to describe the method and apparatus of the present invention, a specific embodiment of a universal burn-in fixture is illustrated for use in burning in a specific type integrated circuit. Specifically, the most commonly used package for integrated circuits is a package type called a dual-in-line or DIP package, and the universal burn-in fixture of the present invention will be described with reference to such a DIP package. It is to be appreciated, however, that the techniques of the present invention are applicable to other types of integrated circuit packages or semiconductor device packages and that the techniques of the present invention are also applicable for the construction of multiple resistor printed circuit boards.

In order to build a universal burn-in fixture, the common characteristics of the pins or package terminals of the DIP packages must be defined. These terminals must be one of the following; input, output, ground or common terminal, Vcc, or power terminal, or none of the foregoing.

In order to properly burn-in or age a semiconductor device, the following must be provided for each one of the above described terminals. First, as to the input terminals which have different pin locations and different quantities for different integrated circuits using the same DIP package, the Vcc must be applied either directly or through a resistor. Secondly, as to the output terminals, which have different pin locations and different quantities for different integrated circuits using the same DIP package, these terminals must be connected to Vcc through a resistor or left open. A further requirement for the output terminals is that the outputs must not be connected directly to each other. Third, as to the ground terminal which is in the same place for most integrated circuits using the same DIP package, this terminal must be either connected to ground or to the common terminal of the Vcc supply. Fourth, as to the Vcc terminal which is in the same place for most integrated circuits using the same DIP package, this terminal must be connected to the Vcc supply. Finally, other terminals which do not fall into any of the above categories and would result in special handling, are ignored as part of the burn-in fixture of the present invention since these other types of terminals are infrequently used.

The above requirements when reduced to their essentials, result in a fixture which must have the following characteristics in order to be universal to a plurality of types of integrated circuits each packaged in a similar housing. First, the ground must be connected to the ground terminal, second, Vcc must be connected to the Vcc or supply terminal, and third, a resistor to Vcc must be provided for all other terminals.

Since it is desirable to provide for the aging of as many packages as posssible on a single fixture, it is necessary to provide for a relatively high density of sockets on each fixture. Present techniques allow for approximately 200 sockets per square foot of fixture surface. Since each socket would require 12 to 13 resistors for different size DIP packages, this results in a requirement of 2,400 to 2,800 resistors per square foot for a universal fixture. It can be seen that although such a requirement could be met by building a fixture having this number of separate resistors, this type of fixture would be relatively expensive, and therefore, impractical. Since this type of universal fixture is impractical, the more common practice in the testing industry is to build a unique fixture for each type of semiconductor device to be aged so as to reduce considerably the number of separate resistors. The testing industry has therefore avoided the mechanical problems of building a universal fixture due to the high resistor density with its resultant mechanical difficulties.

The present invention provides for a universal burn-in fixture by using a conductive pattern on a printed circuit board that has a controlled and definable distance between separate pads and a surrounding land area and with the socket terminals connected to the pads. Such a printed circuit board may be made using standard printed circuit techniques. In order to provide for the necessary resistors, a resistive coating is applied to substantially the entire surface of the printed circuit board including the land area, and the individual pads, and this resistive coating provides for individual resistors to be formed between each pad and the surrounding land area. This structure effectively provides for the possibility of a resistor for each terminal and with the value of the resistor being a function of the length to width ratio between the pad and the surrounding area and the resistance per unit square of the resistive material which is applied to the printed circuit board.

The supply voltage Vcc may be connected to the conductive land area and in order to provide for the direct connection of Vcc to the Vcc terminal, a direct connection may be provided between the pad and the land area at the Vcc terminal. The structure of the universal burn-in fixture of the present invention may therefore be visualized as a plurality of pads or islands surrounded by conductive material and with the space between the pads and the surrounding conductive area bridged by the resistive material to form the plurality of resistors. As indicated above, the Vcc terminal may be bridged directly to the surrounding conductive area, but with all of the other socket terminals connected to Vcc through separate resistors. This structure also results in the ground terminal including a useless resistor between Vcc and ground but a direct connection to ground may be provided by using the opposite side of the printed circuit board and including a plurality of ground busses connected to each ground terminal. The pad area for the ground terminal may be eliminated so as to greatly increase this useless resistance and thereby prevent excess drain of the Vcc supply.

The structure of the present invention has many advantages over prior art attempts to build a universal burn-in fixture since it uses standard materials and processes such as standard printed circuit techniques followed by a coating with a resistive material. This use of standard materials and processes provides for a low cost in the building of the universal burn-in fixture. The need for such a fixture has been apparent to the semiconductor testing industry for a long time and results in a considerable cost saving in the burn-in of semiconductor devices.

As indicated above, the techniques of the present invention may be used not only for the production of a universal burn-in fixture, but may also be used to provide for a low cost printed circuit board having a multiplicity of resistors formed from a single layer of resistive material so as to provide for a complete resistive circuit using printed circuit techniques.

The particular embodiment of the present invention for use as a universal burn-in fixture and also as a means of providing a printed circuit board having a multiplicity of resistors may be seen with reference to the following description and drawings wherein, FIG. 1 illustrates a front view of a universal burn-in fixture of the present invention;

FIG. 2 illustrates a top view of the universal burn-in fixture of the present invention shown in FIG. 1;

FIG. 3 illustrates a fragmentary portion of the bottom of the printed circuit board opposite to the portion shown in FIG. 2a;

Figure 2A:
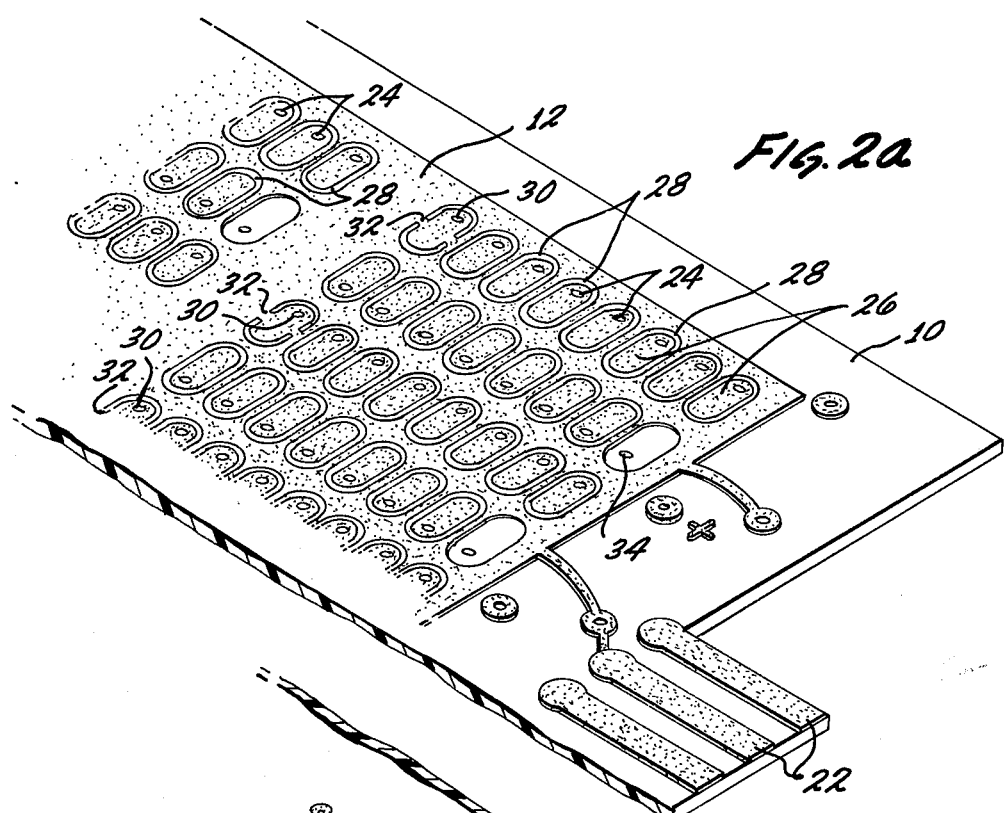
FIG. 2a illustrates a fragmentary portion of the universal burn-in fixture of the present invention showing the conductive pattern on the side of the printed circuit board which receives the resistive coating.

In FIG. 1, a front view of a universal burn-in fixture of the present invention is shown and it can be seen that the fixture is formed from a printed circuit board having a plurality of layers. A central layer of insulating material 10 is the basic structural support member and may be of the type of insulating material commonly used in printed circuit boards. A pair of conductive layers 12 and 14 are disposed on opposite sides of the insulating member 10 and these conductive layers are formed in predetermined patterns using standard printed circuit techniques.

Disposed over the conductive layer 12 is a layer of resistive material 16 and as will be explained at a later portion of this specification, this resistive layer substantially covers the entire conductive pattern 12. A plurality of sockets 18 are supported on the fixture through the use of lead or pin members 21 which extend through openings in the various layers forming the universal burn-in fixture. The sockets 18 are of a standard type to receive semiconductor devices, such as integrated circuits 20 packaged in a dual-in-line or DIP configuration. It is to be appreciated that other types of sockets may be used to accommodate semiconductor devices having other standard package configurations.

As shown in FIG. 2, the universal burn-in fixture of the present invention is divided into a plurality of predetermined areas each of which accommodates a socket 18 for receiving an IC chip 20. These areas are formed in rows and columns so that a large number of IC circuits may be aged at the same time. The burn-in fixture also includes an edge portion 22 having a plurality of parallel conductive fingers. At least some of the fingers are connected to the land portion of the conductive pattern 12 and with the area 22 forming a standard printed circuit connector member to be received within a socket (not shown) which is used to supply the power and ground connection to the burn-in fixture of the present invention.

It can be seen in FIG. 2 that of each socket lead position on the board, an opening 24 extends through the printed board. The openings 24 are plated using a standard hole plating process so as to provide a connection through the board. Surrounding substantially all of these openings 24 at each socket lead position are small pads or islands of conductive material 26. This may be seen more clearly in FIG. 2a where the plurality of openings 24 are shown to be located within these pads or islands of conductive material 26. The islands of conductive material 26 are spaced from the surrounding conductive layer 12, which is called the land, and this spacing 28 would normally be produced by etching away the conductive material so that the islands 26 are insulated from the land 12 while at the same time protecting the plating in the holes 24.

It will be noted in the particular example shown in FIG. 2a that two of the pad areas have a different configuration from the remaining pads at each socket lead position. Specifically, at a pad area 30 the pad and the land are interconnected by a bridge 32 so that a positive voltage Vcc supplied to the conductive land area 12 is directly connected to the socket at the position 30. This is to insure that the Vcc voltage is coupled directly to the Vcc lead of the integrated circuit which is standardized to be at the position shown as position 30 in FIG. 2a. It is to be appreciated that at the position 30 the pad may be eliminated so that the Vcc lead would pass directly into the land area.

Diagonally opposite from the socket position 30 is a socket position 34 where the entire pad area has been removed. The pad position 34 corresponds to the standard ground position for an integrated circuit. The elimination of the conductive pad area provides for an increase in the value of the useless resistor formed between the ground lead and Vcc. An increase of this ground resistance reduces energy consumption.

The resistance provided between the conductive land area 12 and each conductive pad 26 is provided by the layer of resistive material 16 shown in FIGS. 1 and 2. This resistive material is applied to the entire conductive area including the land 12 and pads 26 and the resistive material bridges the space 28 between the pads 26 and land 12 to form a resistor at each pin position 24. The value of the resistor is a function of length to width ratio and resistance per unit square of the resistive material which is used. For example, a resistive material such as graphite suspended in a binder to form a resistive paint may be used to form the resistive layer. It is to be appreciated, however, that other resistive materials may be used and the invention is not to be limited to a specific resistive material.

Figure 4:
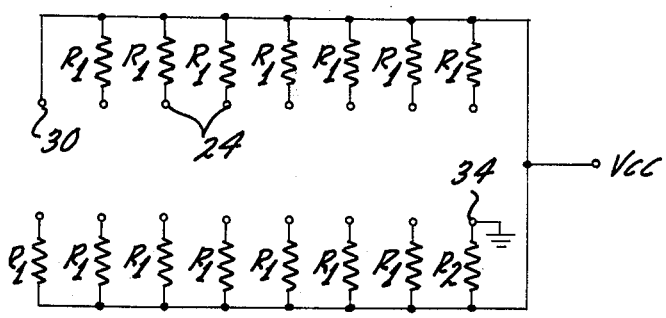
FIG. 4 illustrates schematically the equivalent electrical circuit for a single socket of the universal burn-in fixture of the present invention.

As indicated above, no pad resistor is formed at socket position 30. At socket position 34 the resistance is greatly increased since the pad is eliminated. These resistances may be seen with reference to FIG. 4 where resistors R1 are formed at substantially all of the pin locations 24 but with a larger value resistor R2 formed at position 34 and no resistor formed at position 30.

Figure 3:
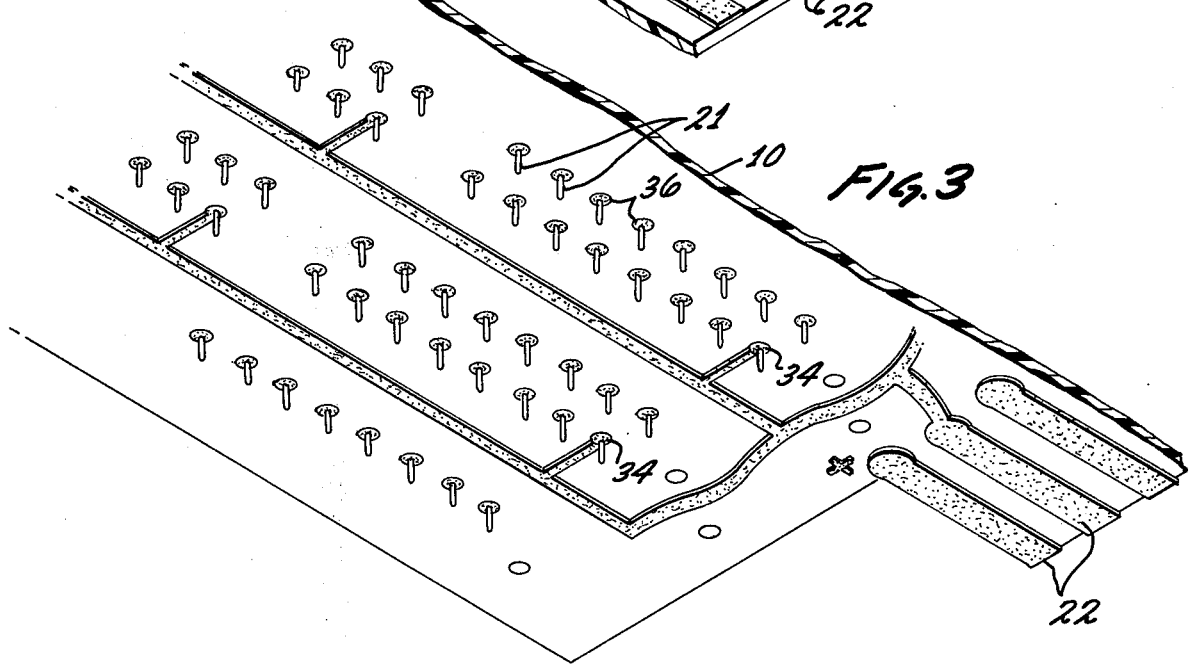

FIG. 3 illustrates the underside of the board opposite to that shown in FIG. 2a and it can be seen that the lead members 21 extend through the board and are soldered to small soldering areas 36 by standard soldering techniques such as flow soldering. This soldering provides for good electrical connection between the pins 21 and the pad areas 26 and 30 shown in FIG. 2a since the holes 24 are plated to provide a connection between the pads 26 and 30 and the solder areas 36.

A ground bus is provided by conductive pattern 14 which ground bus runs between the leads for each socket and is connected to the ground pin at position 34 for each socket. The ground bus is then coupled through the connector edge portion 22 to a ground circuit for grounding the IC devices during the aging of the IC devices 20.

Figure 5:
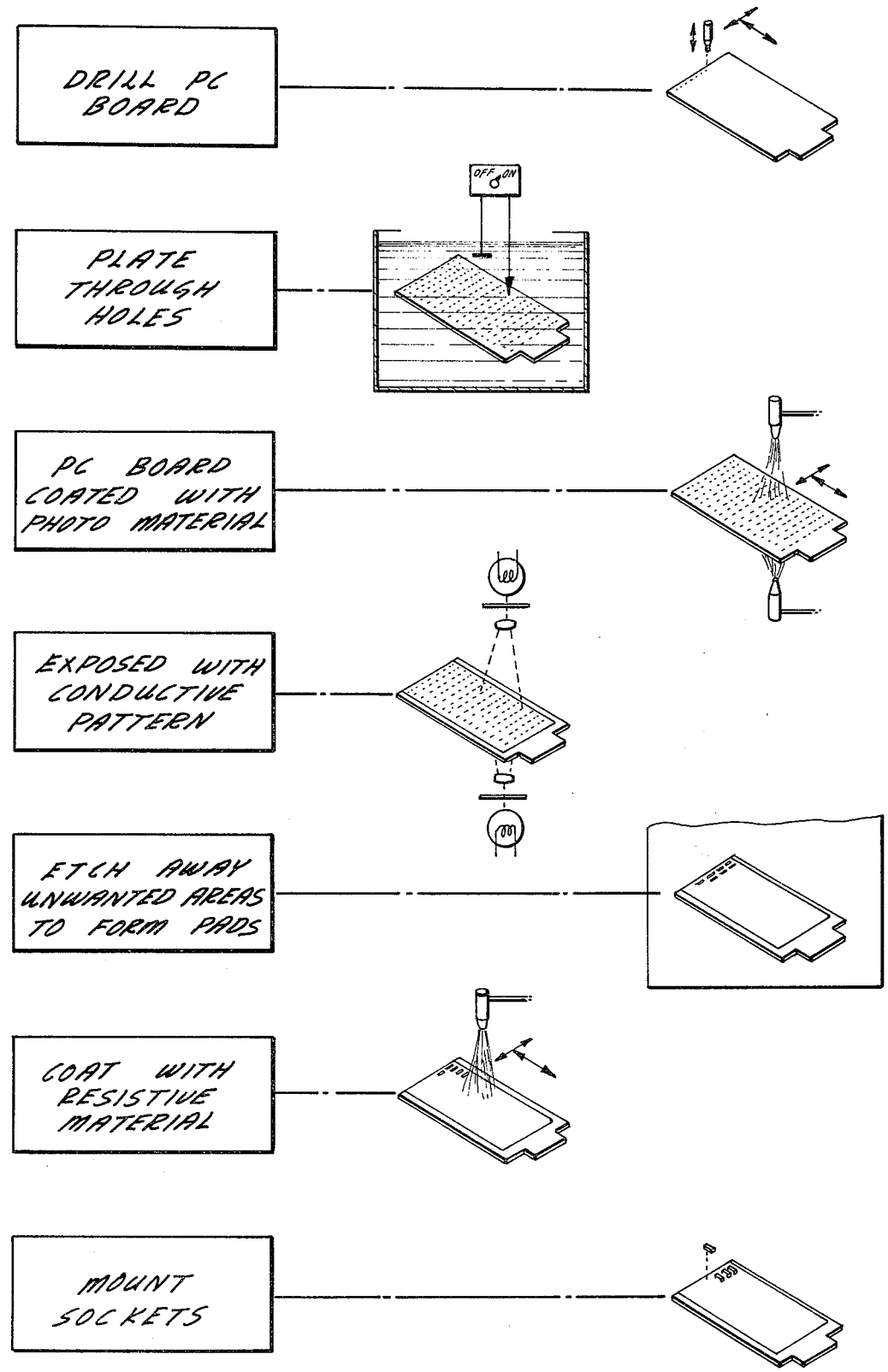
FIG. 5 illustrates a flow chart of the method of making the universal burn-in fixture of the present invention and specifically, making the printed circuit board prior to installation of the sockets.

FIG. 5 illustrates a method of producing the universal burn-in fixture of the present invention. Initially, a standard double conductive clad PC board is formed to the general shape shown in FIG. 2, and the first step would be to drill the PC board in a predetermined socket pattern corresponding to the plurality of socket positions on the board shown in FIG. 2. After the board has been drilled in the predetermined pattern, a hole plating operation connects the two sides of the board through the holes. The printed circuit board is next coated with photoresist material and such coating may be provided on both sides of the board. The photoresist on both sides of the board is next exposed with particular desired conductive patterns and FIGS. 2, 2a and 3 illustrate specific forms of conductive patterns which provide for the desired characteristics for a universal burn-in fixture. In addition the pattern provides for protection of the hole plating during the etching. The exposed conductive pattern is then developed and the printed circuit board is next immersed in an acid solution to etch away the unwanted areas to form the pads separated from the land on one side of the board and the ground busses on the other side of the board and with hole plating to provide connection through the board.

The final step which provides for all of the resistors is merely to coat one side of the board and specifically cover the conductive pattern including the pads surrounded by the land with a resistive material. This layer of resistive material provides for the multitude of resistors necessary to form a universal burn-in fixture which fixture would be used to test a plurality of different types of semiconductor devices wherein the only common characteristics between the semiconductor devices are the positions for the Vcc and ground terminals. The remaining terminal positions for these different types of semiconductor devices are used for different types of inputs and outputs depending upon the particular characteristics of the semiconductor device.

The final steps to making the burn-in fixture would be mount the sockets and solder them in position with the mounting shown in FIGS. 1 and 2.

It is to be appreciated that although one embodiment of the invention has been shown with reference to a universal burn-in fixture for a DIP integrated circuit package having 16 leads, the invention is not limited to this specific package. Other DIP packages having smaller or larger numbers of leads and also other types of standard semiconductor packages may also have appropriate universal fixtures with similar structure to that shown in FIGS. 1 through 4.

Figure 6:
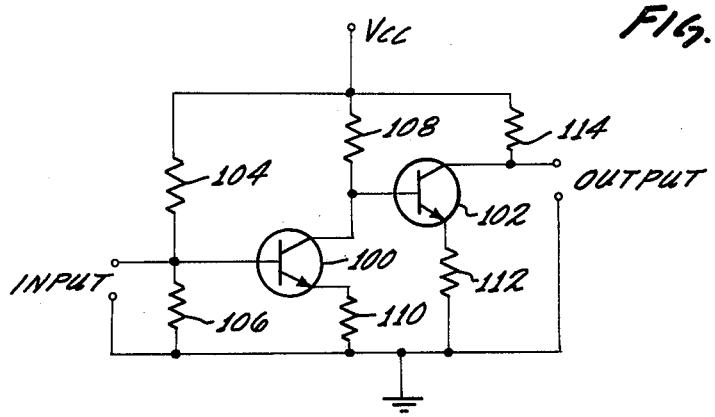
FIG. 6 illustrates a schematic of an electrical circuit to be constructed in accordance with the teachings of the present invention.
Figure 7:
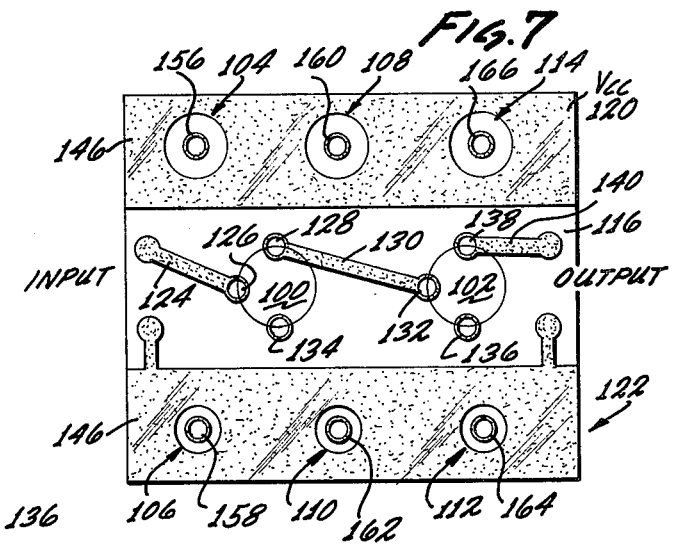
FIG. 7 illustrates a top view of a printed circuit board forming a multiplicity of resistors equivalent to the schematic of FIG. 6.
Figure 8:
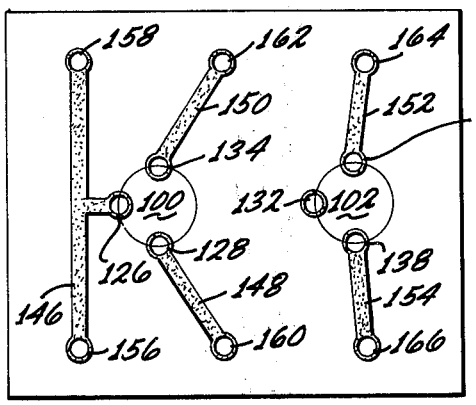
FIG. 8 illustrates a bottom view of the printed circuit board of FIG. 7.

FIGS. 6, 7 and 8 illustrate a second embodiment of the invention and specifically illustrate the use of the invention to provide for a plurality of resistive elements from a single layer of resistive material in combination with a printed circuit board having a particular conductive pattern. Specifically, FIG. 6 illustrates a desired electronic circuit including a pair of transistors 100 and 102 which are to be intercoupled using a resistive divider network. For example, the input to the circuit is applied to a voltage divider including a pair of resistors 104 and 106 and with resistor 104 coupled between a voltage supply Vcc and the input terminal and with the resistor 106 coupled between ground and the input terminal and with the input terminal also coupled to the base of the transistor 100.

The output from the transistor 100 is taken across a resistor 108 which is coupled between the collector of the transistor 100 and Vcc and with this output signal also applied to the base of transistor 102. The emitter of transistor 100 is coupled to ground through a resistor 110. The emitter of transistor 102 is also coupled through a resistor 112 to ground. The output of the transistor 102 is taken across resistor 114 which is coupled between the collector of transistor 102 and Vcc.

Figure 9:
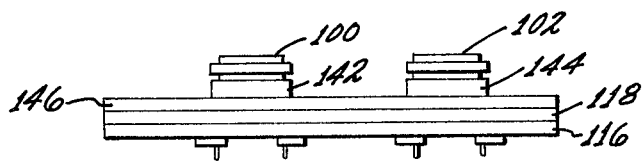
FIG. 9 illustrates a front view of the printed circuit board of FIGS. 7 and 8 showing the sockets and transistors in position on the printed circuit board.

It can be seen that such a circuit as shown in FIG. 6 includes a plurality of resistive elements 104 through 114 and it would be desirable to provide for such plurality of resistive elements using a single layer of resistive material. FIGS. 7, 8 and 9 illustrate such a structure and include an insulating base member 116. In FIG. 7, the insulating base member is shown to include a conductive Vcc portion 120 and a conductive ground portion 122. An input line 124 is connected to the base terminal of transistor 100 and through a hole plated opening 126. A hole plated opening 128 is coupled through a conductive path 130 to a hole plated opening 132 which is the base area for the base of transistor 102.

A hole plated opening 134 is used for the emitter of transistor 100 and a hole plated opening 136 is used for the emitter of transistor 102. Finally, a hole plated opening 138 for the collector of the transistor 102 is coupled to an output line 140. The transistors 100 and 102 may be coupled either directly to the hole plated openings by soldering the leads within the openings on the underside of the board 116, or socket members 142 and 144 as shown in FIG. 9 may be used to receive the transistors 100 and 102. If socket members are used, then these socket members are soldered to the board in a manner similar to that shown in FIG. 3 for the first embodiment of the invention. Specifically, as shown in FIG. 9, lead members are shown protruding from the bottom portion of the board which lead members represent the positions for the base, emitter and collector of the transistors 100 and 102.

As shown in FIG. 8, a plurality of conductive paths 146 to 154 extend from the hole plated openings 126, 128, 134, 136 and 138 to a second group of hole plated openings 156 to 166. The second group of hole plated openings are surrounded by the Vcc area 120 and the ground area 122 to provide for the plurality of resistances when substantially all of the conductive areas 120 and 122 of the printed board 116 are covered with a layer of resistive material 146. The resistive material 146 bridges the spacings to provide for the resistances 104 through 114 shown in FIG. 6 and the desired value of resistance may be provided by the appropriate spacing between the hole plated openings and the Vcc and ground areas. As indicated above, the layer of resistive material may be a material such as graphite suspended in a binder so that the resistive material may be applied by painting or spraying the resistive material on the conductive surface. In order to prevent spraying of the area between the conductive areas 120 and 122, this area may be masked using masking tape prior to the spraying with the resistive material. This eliminates leakage resistane paths since resistances are formed only between the transistor terminals and the Vcc and ground areas.

It can be seen therefore, that the present invention is directed to a structure for providing for a plurality of resistances using a single layer of resistive material and with the resistances formed between spaced conductive areas so that the specific geometry of the conductive areas provide for a desired pattern that has controlled and definable distances and areas between pads and adjacent land areas and with the resistances produced using the single layer of resistive material. Specifically, the invention may be used with semiconductor devices to provide for a resistance to each lead or substantially all the leads of the semiconductor devices so as to produce either a desired electronic circuit or in a specific embodiment of the invention, to provide for a universal burn-in fixture having substantially all of the lead members including a resistance between the lead member and a constant voltage.

Although the invention has been described with reference to particular embodiments, it is to be appreciated that various adaptations and modifications may be made and the invention is only to be limited by the appended claims.

I claim:
1. A universal burn-in fixture for aging a plurality of semiconductor devices at the same time, and wherein the semiconductor devices may be any one of a plurality of types which are enclosed in a standard package having a plurality of leads in predetermined locations, including,
a printed circuit board having a layer of conductive material on at least one side of the board,
the printed circuit board subdivided into a plurality of areas each conforming in size to receive a semiconductor device of standard configuration and with each area containing a plurality of openings conforming in location to the predetermined locations of the plurality of leads for each standard semiconductor package,
the layer of conductive material formed in a conductive pattern of pads of conductive material spaced from and surrounded by the remaining layer of conductive material and with the pads of conductive material surrounding predetermined ones of the openings, and
a unitary layer of resistive material covering substantially all of the layer of conductive material and bridging the spacing between the pads of conductive material and the surrounding conductive material to form a separate resistor between each pad and the surrounding conductive material.

2. The universal burn-in fixture of claim 1 wherein each of the plurality of types of semiconductor devices include a voltage supply lead and a ground lead at standard positions and wherein each area of the printed circuit board includes openings at locations conforming to the positions of the supply lead and the ground lead and wherein the remaining layer of conductive material surrounds the opening for the supply lead to provide a direct connection and wherein the burn-in fixture includes a ground connection to the opening of the locations conforming to the ground leads.

3. The universal burn-in fixture of claim 2 wherein the ground connection includes at least one ground buss formed as a conductive layer on the side of the printed circuit board opposite to the one side.

4. The universal burn-in fixture of claim 1 additionally including sockets for receiving the semiconductor devices and with each socket located at one of the plurality of areas of the printed circuit board and with each socket including leads passing through the openings for electrical connection to the printed circuit board.

5. The universal burn-in fixture of claim 1 wherein the semiconductor devices are integrated circuits enclosed in a DIP package and wherein the printed circuit board is subdivided into rows and columns.

6. A universal burn-in fixture for receiving a plurality of electronic elements including,
 a support member of insulating material,
 a conductive layer supported by the insulating material for receiving the plurality of electronic elements at predetermined positions,
 the conductive layer including a plurality of pads for connection to the electronic elements and with the pads spaced from a surrounding conductive land area of the conductive layer, and
 a unitary layer of resistive material covering substantially all of the conductive layer and bridging the spacing between the pads and the land area to form separate resistors between each pad and the land area.

7. The universal burn-in fixture of claim 6 wherein each of the electronic elements include a voltage supply lead and a ground lead at standard positions and wherein each predetermined position includes openings at locations conforming to the positions of the supply lead and the ground lead and wherein the land area of conductive material surrounds the opening for the supply lead to provide a direct connection and wherein the burn-in fixture includes a ground connection to the opening at the locations conforming to the ground leads.

8. The universal burn-in fixture of claim 7 wherein the ground connection includes at least one ground buss formed as a conductive layer on the other side of the insulating member.

9. The universal burn-in fixture of claim 6 wherein the electronic elements include sockets and with each socket located at one of the predetermined positions on the conductive layer and with each socket including members for electrical connection to the conductive pads.

10. The universal burn-in fixture of claim 6 wherein the electronic elements include integrated circuits enclosed in a DIP package and wherein the predetermined positions are subdivided into rows and columns.

11. A support member including a plurality of resistive elements, including
 a support member of insulating material,
 a conductive layer supported by the support member on at least one side of the support member,
 the conductive layer including a plurality of pads and with the pads spaced from at least one conductive land area forming the remaining portion of the conductive layer and with the land area at least partially surrounding the pads, and
 a unitary layer of resistive material covering substantially all of the conductive layer and bridging the spacing between the pads and the land area to form resistors between the pad and the land area.

12. The support member of claim 11 additionally including a plurality of electronic elements each including a voltage supply lead and a ground lead of standard positions and wherein the land area of conductive material provides a direct connection to the supply lead and additionally including a ground connection to the locations conforming to the ground leads.

13. The support member of claim 12 wherein the ground connection includes at least one ground buss formed as a conductive layer on the other side of the support member.

14. The support member of claim 11 additionally including sockets and with each socket located on the conductive layer and with each socket including members for electrical connection to the conductive pads.

15. The support member of claim 11 wherein the land area is formed into a voltage supply section and a ground section and wherein the resistors are formed between the pads and the voltage supply section and the ground section.

* * * * *